United States Patent
Beckedahl et al.

(10) Patent No.: US 7,613,008 B2
(45) Date of Patent: Nov. 3, 2009

(54) POWER SEMICONDUCTOR MODULE WITH CAPACITORS CONNECTED PARALLEL TO ONE ANOTHER

(75) Inventors: Peter Beckedahl, Oberasbach (DE); Ludwig Hager, Nuremberg (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 521 days.

(21) Appl. No.: 11/603,606

(22) Filed: Nov. 22, 2006

(65) Prior Publication Data

US 2007/0117421 A1    May 24, 2007

(30) Foreign Application Priority Data

Nov. 22, 2005 (DE) .................... 10 2005 055 608

(51) Int. Cl.
*H01R 9/00* (2006.01)
(52) U.S. Cl. .................... 361/775; 361/763; 361/823; 361/824
(58) Field of Classification Search ......... 361/763–766, 361/775, 822–830, 700–710; 257/690–692; 439/76.1–76.2
See application file for complete search history.

(56) References Cited

U.S. PATENT DOCUMENTS

| | | | | |
|---|---|---|---|---|
| 5,822,189 A | * | 10/1998 | Isshiki | 361/736 |
| 6,249,448 B1 | * | 6/2001 | Regnier et al. | 363/144 |

* cited by examiner

*Primary Examiner*—Tuan T Dinh
(74) *Attorney, Agent, or Firm*—Cohen Pontani Lieberman & Pavane LLP

(57) ABSTRACT

A power semiconductor module is presented. The power semiconductor module includes a plurality of capacitors coupled in parallel with each other. Each of the plurality of capacitors each includes a first and a second connection element. The power semiconductor module further includes a first and a second busbar. The first connection element of each of the plurality of capacitors is bonded to the first busbar, and the second connection element of each of the plurality of capacitors is bonded to the second busbar. The power semiconductor module further includes an insulating element disposed between the first busbar and the second busbar, and a pressure assembly that includes at least one pressure body and one associated counterpart pressure body. The first connection element and the second connection element of each of the plurality of capacitors is subjected to pressure and electrically bonded to the associated busbars by the pressure assembly.

10 Claims, 2 Drawing Sheets

POWER SEMICONDUCTOR MODULE WITH CAPACITORS CONNECTED PARALLEL TO ONE ANOTHER

BACKGROUND OF THE INVENTION

1. Field of the Invention

The invention relates generally to power semiconductor modules, and more particularly to a power semiconductor module that includes capacitors connected in parallel to one another, and that includes first connection elements bonded to a first busbar and second connection elements bonded to a second busbar, an insulating element between the two busbars, and a pressure assembly.

2. Description of the Related Art

Power semiconductor modules are known in the art and used in inverter systems, in which capacitors are electrically connected with two busbars by means of soldered, welded, or screw contacts. The reliability of such soldered, welded, or screw contacts is inconsistent.

In highly reliable power semiconductor modules, pressure contacts are preferred in chip and direct copper bonding (DCB). However, such pressure bonding has not yet been achieved with respect to the connection elements of capacitors. This is because the connection elements of capacitors are located in a different plane, or are oriented in a different direction from the DCB contacts, and an additional pressure system would consequently be necessary.

SUMMARY OF THE INVENTION

An object of the invention is to provide a power semiconductor module that includes a plurality of capacitors coupled in parallel with each other, where each of the plurality of capacitors includes a first connection element and a second connection element and first and second busbars, wherein the first connection element of each of the plurality of capacitors is bonded to the first busbar, and the second connection element of each of the plurality of capacitors is bonded to the second busbar. The semiconductor module further includes an insulating element disposed between the first busbar and the second busbar, and a pressure assembly including at least one pressure body and one associated counterpart pressure body. The first connection element and the second connection element of each of the plurality of capacitors is subjected to pressure and electrically bonded to the associated busbars by the pressure assembly. The bonding of the connection elements of the capacitors is reliable, and can be produced economically.

The at least one pressure body, for subjecting the first connection elements to pressure, includes elastic arms, and the associated counterpart pressure body is rigid. The at least one pressure body, for subjecting the second connection elements to pressure, includes rigid second arms, and the associated counterpart pressure body includes elastic portions. The elastically embodied portions of the associated counterpart pressure body comprise freestanding struts. The first and second arms are disposed proximate to each other and protrude in a parallel direction away from the pressure body. The first and second arms protrude the same distance away from the pressure body.

The elastic portions of the counterpart pressure body are disposed below, and vertically aligned with, the second arms of the at least one pressure body. The capacitors are fixed between the pressure body and the counterpart pressure body of the pressure assembly.

In the capacitors of the power semiconductor module, the connection elements include soldered capacitor pins. According to the invention, a pressure bonding is proposed instead of typical soldered connections. The pressure bonding is of the kind that is attained only with chip and DCB bonding.

It has proved expedient to fix the capacitors in a secured way between the pressure body and the counterpart pressure body of the pressure assembly, in order to meet the various demands in terms of the jarring resistance and impact resistance of the power semiconductor module. To that end, an elongated retaining device oriented parallel to the first and second busbars protrudes away from the pressure body and includes a cushion element, and the counterpart pressure body includes positioning elements for the plurality of capacitors. The cushion element may be a strip of plastic foam material, which is fixed on the side of the retaining device oriented toward the counterpart pressure body. The positioning elements of the counterpart pressure body may be formed by grooves and/or by contoured struts, which are embodied integrally in terms of material with the counterpart pressure body.

In the power semiconductor module of the invention, the capacitors are disposed parallel to one another and side-by-side in one row next to the first and second busbars and are located at least approximately in the same plane as the first and second busbars.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, like reference characters refer to the same parts throughout the different views. Also, the drawings are not necessarily to scale, emphasis instead generally being placed upon illustrating the principles of the invention.

DETAILED DESCRIPTION OF THE PREFERRED EMBODIMENTS

Figure 1:
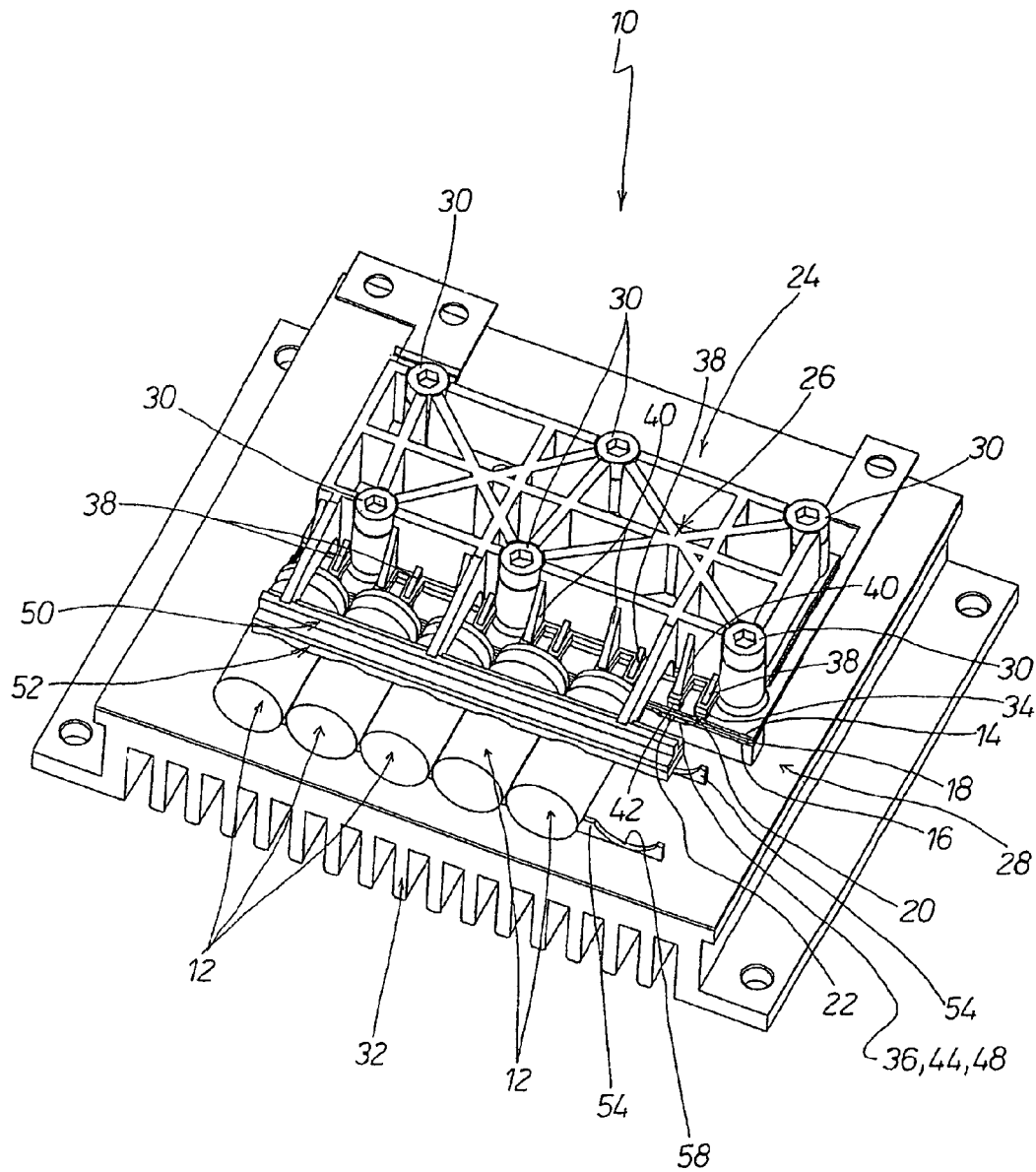
FIG. 1 is an illustrative perspective view of a power semiconductor module, according to one embodiment of the invention.

FIG. 1 shows a view of the power semiconductor module 10 with capacitors 12, which are disposed proximate to each other in one row and are connected in parallel to one another. This parallel connection is achieved by a first busbar 14 and a second busbar 16, between which an insulating element 18 is disposed. The first busbar 14 is bonded to first connection elements 20 of the capacitors 12, and the second busbar 16 is bonded to second connection elements 22 (see also FIG. 2) of the capacitors 12. This bonding of the connection elements 20 and 22 with the busbars 14 and 16 is accomplished with a pressure assembly 24 of the power semiconductor module 10. The pressure assembly 24 includes a pressure body 26 and a counterpart pressure body 28. The pressure assembly 24 also serves the purpose of pressure bonding semiconductor chips to a circuit board (not shown), circuit substrate, or the like.

In one embodiment, the pressure body 26 is braced to the counterpart pressure body 28 by means of screw elements 30. In another embodiment, the pressure body 26 is braced with the counterpart pressure body 28 with the aid of screw elements 30 that are screwed into a heat sink 32 of the power semiconductor module 10.

Figure 2:
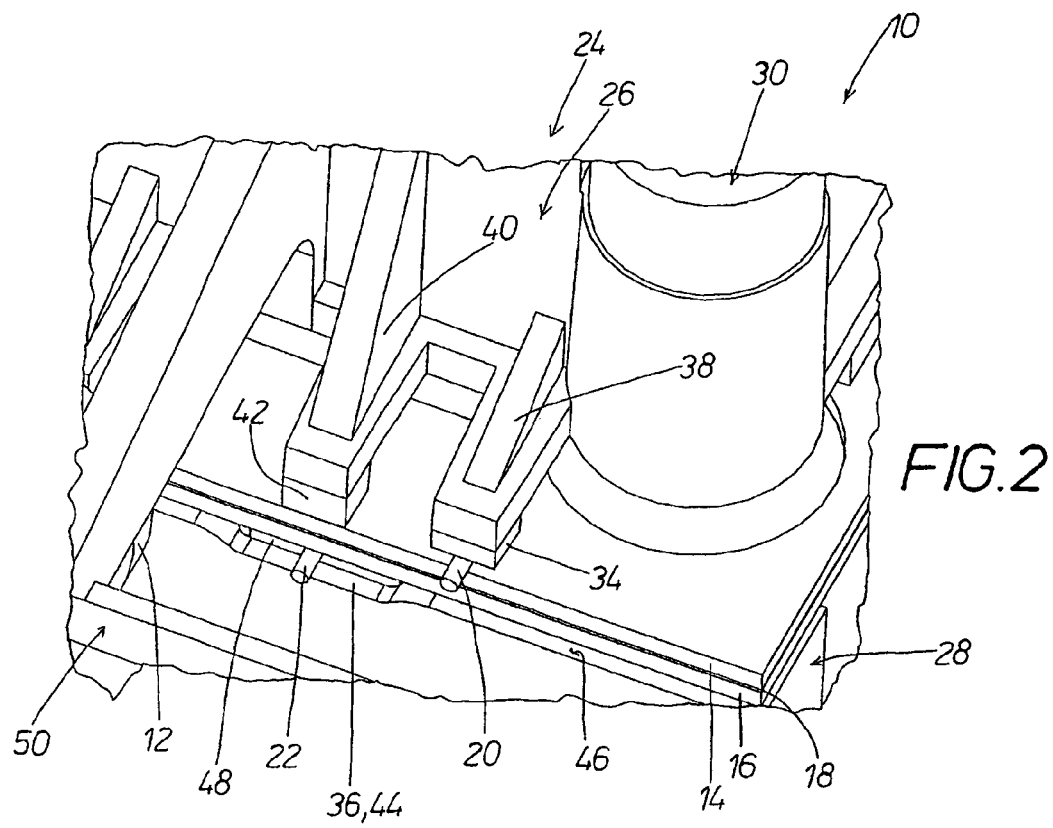
FIG. 2 is an illustrative perspective fragmentary view of a portion of the power semiconductor module of FIG. 1, including pressure bonding of two capacitor connection elements with associated busbars.

As can be seen in FIG. 2, the pressure body 26 includes pressure elements 34 for the first connection elements 20, and the counterpart pressure body 28 includes pressure portions 36 for the second connection elements 22 of the capacitors 12 (see FIG. 1).

As can also be seen from FIG. 1, the capacitors 12 are fixed between the pressure body 26 and the counterpart pressure body 28 of the pressure assembly 24.

First arms 38, on which the pressure elements 34 are provided, protrude away from the pressure body 26. Second arms 40 also protrude away from the pressure body 26 and are pressed with pressure devices 42 against the first busbar 14 and disposed above, and vertically aligned with, the second connection elements 22 of the capacitors. The first and second arms 38 and 40 of the pressure body 26 are disposed parallel to one another and spaced slightly apart from one another. Each pressure element 34 and the adjacent pressure device 42 protrude an equal distance away from the pressure body 26 of the pressure assembly 24.

Figure 3:
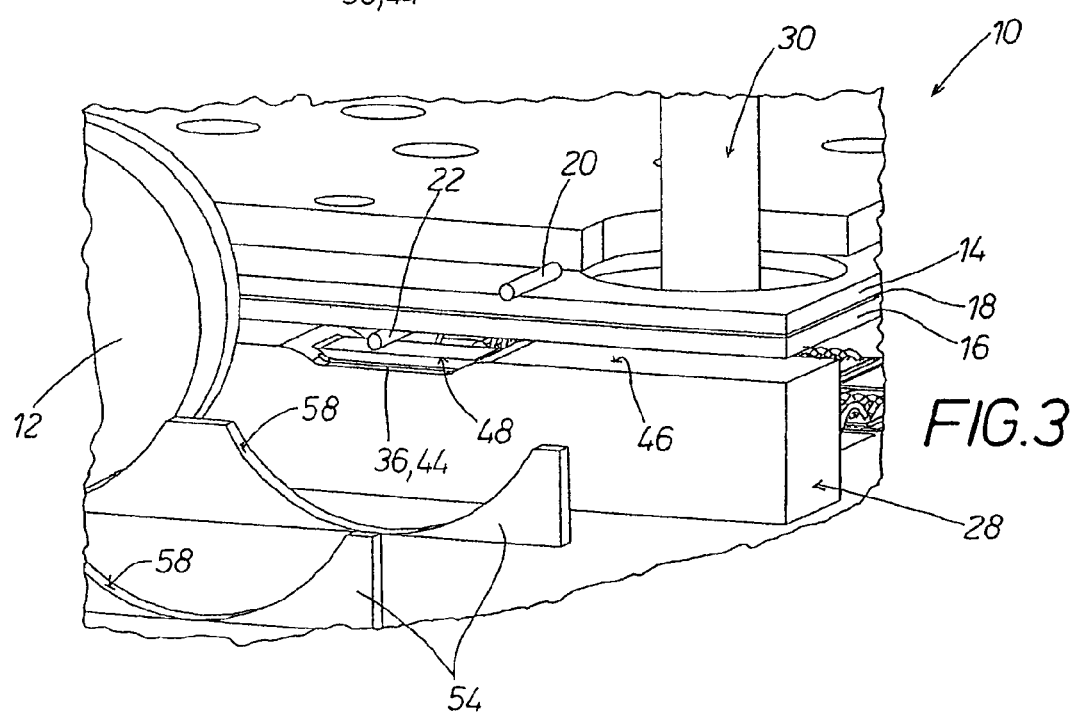
FIG. 3 is an illustrative perspective fragmentary view of the power semiconductor module of FIG. 1 including positioning elements for capacitors and an elastic element for a second connection element of a capacitor.

As can be seen from FIG. 2, the pressure portions 36 are formed by grooves 44, which are included in main face 46, toward the second busbar 16 of the counterpart pressure body 28. In each groove 44, an elastic element 48 is provided for the associated second connection element 22 of the respective capacitor 12 (see FIG. 3).

The capacitors 12 are fixed in a resilient manner between the pressure body 26 and the counterpart pressure body 28 of the pressure assembly 24. For this purpose, an elongated retaining device 50 protrudes away from the pressure body 26 and includes a cushion element 52 (see FIG. 1). The counterpart pressure body 28 includes positioning elements 54 for the capacitors 12. In one embodiment, the positioning elements 54 are configured as ribs, which have rib contours 58 that correspond in shape to the shape of the capacitors 12.

Variations, modifications, and other implementations of what is described herein may occur to those of ordinary skill in the art without departing from the spirit and scope of the invention. Accordingly, the invention is not to be defined only by the preceding illustrative description.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module, comprising:
    a plurality of capacitors coupled in parallel with each other, each of the plurality of capacitors comprising a first connection element and a second connection element;
    a first busbar and a second busbar, the first connection element of each of the plurality of capacitors being bonded to the first busbar, and the second connection element of each of the plurality of capacitors being bonded to the second busbar;
    an insulating element disposed between the first busbar and the second busbar; and
    a pressure assembly comprising at least one pressure body and one associated counterpart pressure body, the first connection element and the second connection element of each of the plurality of capacitors being subjected to pressure and electrically bonded to the respective first and second busbars by the pressure assembly.

2. The power semiconductor module according to claim 1, wherein the at least one pressure body includes elastic first arms and rigid second arms and the associated counterpart pressure body includes rigid portions and elastic portions, the pressure assembly is configured to press each of the first connections between one of the elastic first arms and one of the rigid portions and to press each of the second connections between one of the rigid second arms and one of the elastic portions.

3. The power semiconductor module according to claim 1, wherein the capacitors are fixed between the pressure body and the counterpart pressure body of the pressure assembly.

4. The power semiconductor module according to claim 1, wherein the plurality of capacitors are oriented parallel to one another and side by side in one row proximate to the first and second busbars and are disposed at least approximately in the same plane as the first and second busbars.

5. The power semiconductor module according to claim 2, wherein the elastically embodied portions of the associated counterpart pressure body comprise freestanding element arranged in a groove defined in the counterpart pressure body.

6. The power semiconductor module according to claim 2, wherein the elastic portions of the counterpart pressure body are disposed below and vertically aligned with the second arms of the at least one pressure body.

7. The power semiconductor module according to claim 3, further comprising an elongated retaining device oriented parallel to the first and second busbars and protruding away from the pressure body, the elongated retaining device comprising a cushion element.

8. The power semiconductor module according to claim 3, wherein the counterpart pressure body comprises positioning elements for the plurality of capacitors.

9. The power semiconductor module according to claim 5, wherein the first and second arms are disposed proximate to each other and extend transversely from a side of the pressure body in a parallel direction.

10. The power semiconductor module according to claim 5, wherein the first and second arms protrude equidistantly from the side of the pressure body.

* * * * *